United States Patent
Bagung et al.

(10) Patent No.: US 10,276,482 B2
(45) Date of Patent: Apr. 30, 2019

(54) METHOD FOR REINFORCING CONDUCTOR TRACKS OF A CIRCUIT BOARD

(71) Applicant: CONTINENTAL AUTOMOTIVE GMBH, Hannover (DE)

(72) Inventors: Detlev Bagung, Bernhardswald (DE); Thomas Riepl, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 1 day.

(21) Appl. No.: 15/504,572

(22) PCT Filed: Aug. 25, 2015

(86) PCT No.: PCT/EP2015/069455
§ 371 (c)(1),
(2) Date: Feb. 16, 2017

(87) PCT Pub. No.: WO2016/030379
PCT Pub. Date: Mar. 3, 2016

(65) Prior Publication Data
US 2017/0236777 A1    Aug. 17, 2017

(30) Foreign Application Priority Data

Aug. 28, 2014 (DE) .......... 10 2014 217 186

(51) Int. Cl.
H05K 3/02 (2006.01)
H05K 3/10 (2006.01)
(Continued)

(52) U.S. Cl.
CPC .... *H01L 23/49822* (2013.01); *H01L 21/4857* (2013.01); *H01L 23/3114* (2013.01);
(Continued)

(58) Field of Classification Search
CPC ......... H01L 23/49822; H01L 23/49827; H01L 23/4985; H01L 23/49838; H01L 23/3114;
(Continued)

(56) References Cited

U.S. PATENT DOCUMENTS 3,197,335 A * 7/1965 Leszynski .............. G01K 7/183
29/620
4,031,268 A * 6/1977 Fairbairn ................. H05K 3/14
118/301
(Continued)

FOREIGN PATENT DOCUMENTS

DE   102006004321 A1   8/2007
DE   102008006495 A1   7/2009
(Continued)

OTHER PUBLICATIONS

Conductor Tracks from Plastic Materials; Reinhausen Plasma GmbH; www.reinhausen-plasma.com; Germany.

*Primary Examiner* — Donghai D Nguyen
(74) *Attorney, Agent, or Firm* — Laurence A. Greenberg; Werner H. Stemer; Ralph E. Locher

(57) ABSTRACT

A method for manufacturing a circuit carrier for electronic components includes making available a carrier material layer made of an electrically insulating material and having at least one connecting layer which is applied at least to a first and/or second surface of the carrier material layer and has in each case a predefined layer thickness. Each connecting layer has a number of electrically conductive connections with a predefined conductor track width. At least some of the connections are strengthened by plasma spraying, at least in certain sections, with additional electrically conductive material. As a result, a greater layer thickness than the predefined layer thickness and/or a larger conductor track width than the predefined conductor track width is obtained.

(Continued)

Furthermore, a circuit carrier for electronic components is specified.

6 Claims, 2 Drawing Sheets

(51) Int. Cl.

| | | |
|---|---|---|
| *H01L 23/498* | (2006.01) | |
| *H05K 3/24* | (2006.01) | |
| *H01L 21/48* | (2006.01) | |
| *H01L 23/31* | (2006.01) | |
| *H01L 23/367* | (2006.01) | |
| *H01L 23/00* | (2006.01) | |

(52) U.S. Cl.
CPC ...... *H01L 23/3675* (2013.01); *H01L 23/4985* (2013.01); *H01L 23/49811* (2013.01); *H01L 23/49827* (2013.01); *H01L 23/49838* (2013.01); *H01L 23/49861* (2013.01); *H01L 23/49866* (2013.01); *H05K 3/245* (2013.01); *H01L 24/32* (2013.01); *H01L 24/48* (2013.01); *H01L 2224/32245* (2013.01); *H01L 2224/45147* (2013.01); *H01L 2224/48091* (2013.01); *H01L 2224/48247* (2013.01); *H01L 2224/73265* (2013.01); *H01L 2924/181* (2013.01); *H05K 2203/095* (2013.01); *H05K 2203/1344* (2013.01); *Y10T 29/49155* (2015.01)

(58) Field of Classification Search
CPC ........... H01L 23/3675; H01L 23/49861; H01L 23/49811; H01L 23/49866; H01L 21/4857; H01L 2224/73265; H01L 2224/32245; H01L 2224/48091; H01L 24/32; H01L 2224/48247; H01L 4/48; Y10T 29/49117; Y10T 29/49155; Y10T 29/49165
USPC .......... 29/620, 825, 846, 852; 174/256, 262; 257/632

See application file for complete search history.

(56) References Cited

U.S. PATENT DOCUMENTS

| | | | |
|---|---|---|---|
| 4,521,476 A | * | 6/1985 | Asai .................... H01L 21/4846 174/261 |
| 8,338,317 B2 | * | 12/2012 | Engelhardt ............... C23C 4/08 257/632 |
| 9,320,178 B2 | | 4/2016 | Oota et al. |
| 2004/0125040 A1 | | 7/2004 | Ferguson et al. |
| 2006/0258055 A1 | | 11/2006 | Okamoto |
| 2014/0238729 A1 | * | 8/2014 | Hsiao ................... H05K 1/0206 174/252 |

FOREIGN PATENT DOCUMENTS

| | | |
|---|---|---|
| DE | 102010016279 A1 | 11/2010 |
| DE | 102011089927 A1 | 6/2013 |
| WO | 2009106114 A2 | 9/2009 |

\* cited by examiner

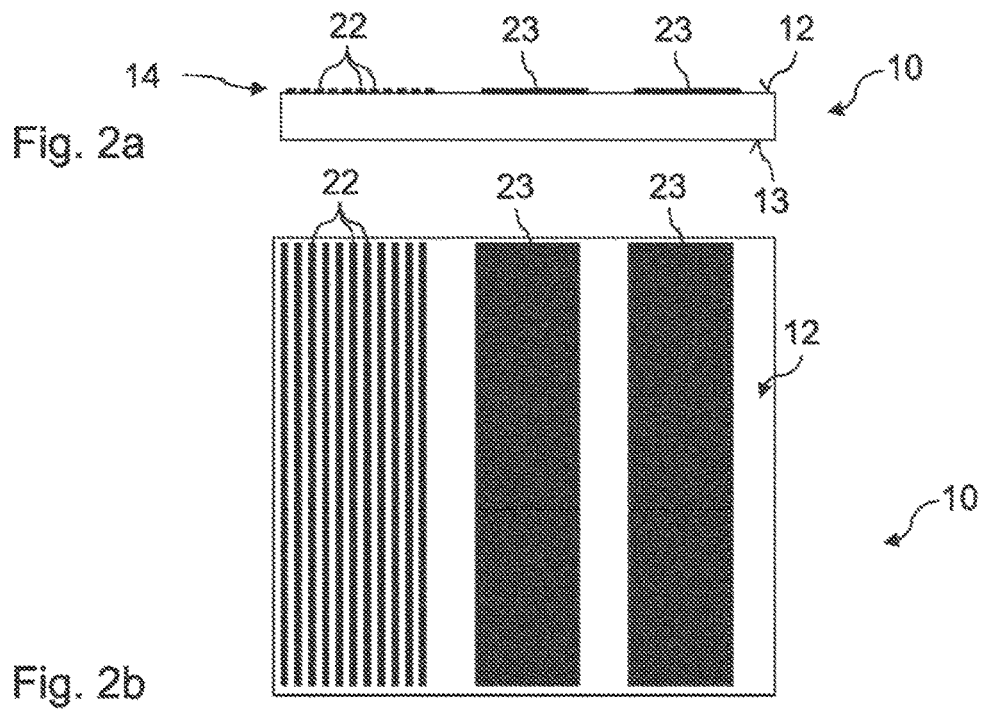
Fig. 2a
Fig. 2b
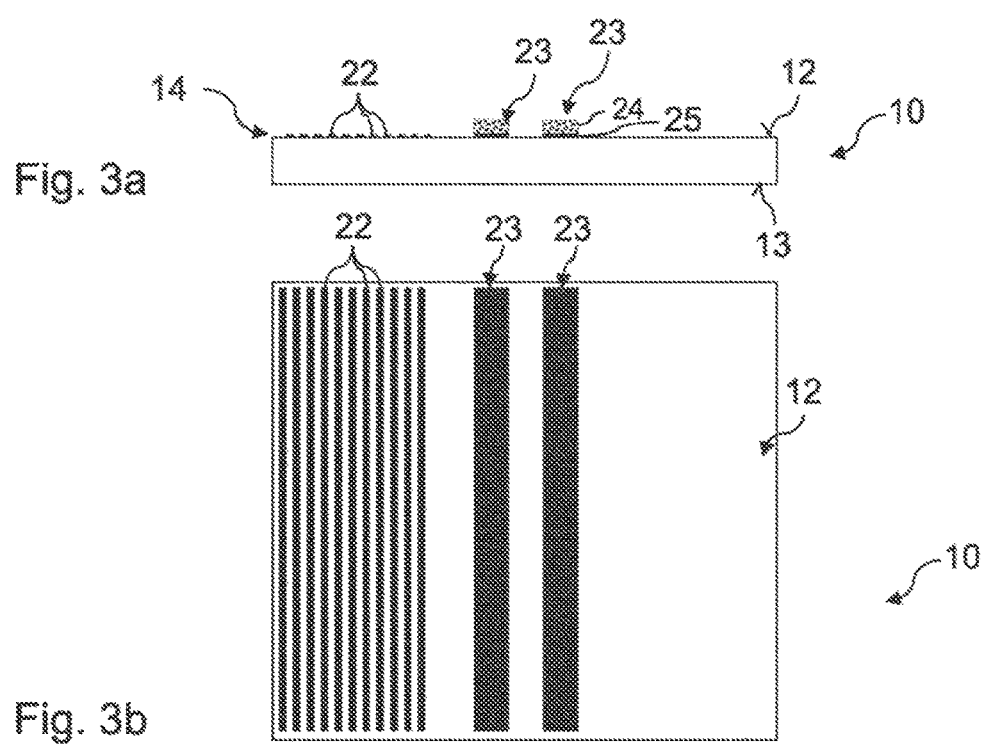
Fig. 3a
Fig. 3b

METHOD FOR REINFORCING CONDUCTOR TRACKS OF A CIRCUIT BOARD

BACKGROUND OF THE INVENTION

Field of the Invention

The invention relates to a circuit carrier for electronic components and a method for producing same. The circuit carrier comprises a carrier material layer composed of an electrically insulating material having a first surface and a second surface, wherein the second surface is arranged parallel to the first surface. The circuit carrier comprises at least one connection layer which is applied at least on the first and/or the second surface of the carrier material layer and has in each case a predefined layer thickness, wherein each connection layer comprises a number of electrically conductive connections having a predefined conductor track width. Such a circuit carrier in the present case is also referred to as a circuit board.

Circuit boards are carriers for electronic components. They serve for the mechanical fixing and connection of the electronic components. A circuit board consists of electrically insulating material with conductive connections, the so-called conductor tracks, adhering thereto. Fiber-reinforced plastic is customary as insulating material. The conductor tracks are usually etched from a thin layer of copper. The components are soldered on soldering pads, or in soldering lands.

There are a multiplicity of different types of circuit boards. Single-sided and double-sided circuit boards are known, for example, in which electrically conductive materials are applied either only on one surface or on the two opposite surfaces of the circuit boards. In the case of so-called multilayered circuit boards, also referred to by the person skilled in the art as multilayer circuit boards, conductor trace structures are arranged in a plurality of layers both on and internally in the circuit board.

Single-sided and double-sided circuit boards with plated-through holes are typically produced photochemically. The conductor tracks are generally produced photolithographically by a thin layer of light-sensitive photoresist being applied on the surface of the initially completely metalized circuit board. After the exposure of the photoresist through a mask with the desired layout of the conductor trace structure, depending on the photoresist used, either the exposed or the unexposed portions of the resist are soluble in an appropriate developer solution and are removed. If the circuit board treated in this way is introduced into a suitable etching solution, then only the uncovered part of the metalized surface is attacked. The portions covered by the photoresist are preserved because the resist is resistant to the etching solution. Afterward, the copper layers can be electrolytically reinforced after the etching in order to obtain the desired layer thickness. In addition, metallic protective and contact layers composed of tin, nickel or gold can be applied electrolytically on partial areas or the entire copper area. A soldering resist is then applied which covers the conductor tracks and leaves free only the soldering locations. Thus, firstly soldering faults are avoided, secondly, the conductor tracks are protected against corrosion.

In the case of multilayered circuit boards, a plurality of thin circuit boards with so-called prepregs are adhesively bonded one on top of another. In this case, "prepreg" denotes a semifinished product consisting of continuous fibers and an uncured thermosetting plastic matrix or a thermosetting plastic fiber-matrix semifinished product such as BMC (Bulk Molding Compound) or SMC (Sheet Molding Compound) containing, instead of continuous fiber fabric, shorter fiber shreds—generally having a length of 50 mm or less—as fiber portion. These multilayer circuit boards may comprise up to 48 layers. 4 to 8 layers are customary in the field of automotive applications.

The connections of the connection layers between the layers are effected by means of so-called plated-through holes. In some applications, it is necessary for reasons of an increased current-carrying capacity, to form a portion of the electrically conductive connections with a larger conduction cross section. For this purpose, copper wires can be applied on a copper film and then be pressed with a second film to form a core. In this case, it is also possible for the copper wires applied on the copper film to be embedded internally in the circuit board. However, this results in undesired restrictions on the design.

For specific applications it is also known to lay insulated wires on the base material of the circuit board and to connect them by means of ultrasonic welding at soldering points and also to fix them on the surface of the base material. As a result, although a high current-carrying capacity of the circuit board is obtained, on account of the method steps this procedure is not suitable for the production of a large number of circuit carriers, for cost reasons.

SUMMARY OF THE INVENTION

It is an object of the present invention to specify a circuit carrier for electronic components which makes it possible to realize a selective increase in electrically conductive connections with high current-carrying capacity in conjunction with low costs in production.

This object is achieved by means of a method for producing a circuit carrier and a circuit carrier having the features of the independent patent claims. Advantageous configurations are evident from the respectively dependent patent claims.

In accordance with one aspect, a method for producing a circuit carrier for electronic components is specified. In accordance with a further aspect, a circuit carrier for electronic components is specified. In accordance with a third aspect, an electronic control unit comprising the circuit carrier and at least one component fixed on the circuit carrier and electrically contacted by means of the circuit carrier, in particular a power component, is specified. For simplification, hereinafter individual configurations and developments are described only on the basis of one aspect (method, circuit carrier or control unit). However, they are respectively also applicable to the other aspects.

The circuit carrier for electronic components has a carrier material layer composed of an electrically insulating material having a first surface and a second surface, which is arranged parallel to the first surface. The circuit carrier furthermore comprises at least one connection layer which is applied at least on the first and/or the second surface of the carrier material layer and has in each case a predefined layer thickness. Here the layer thickness corresponds to the height of the conductor tracks realized in the respective connection layer. Each connection layer comprises a number of electrically conductive connections, the so-called conductor tracks, having a predefined conductor track width. In the method, such a carrier material layer with connection layer is provided.

According to the invention, at least some of the connections are reinforced by plasma spraying at least in sections with additional electrically conductive material, as a result of which a conductor track width greater than the predefined conductor track width and/or, preferably, a layer thickness greater than the predefined layer thickness are/is provided. Plasma spraying here comprises, in particular, applying the additional material by a plasma jet being generated by means of a plasma torch and the additional material being injected into the plasma jet as powder. The grains of the powder are incipiently melted or melted by the plasma jet and applied on the carrier material layer and/or the connection layer by spin coating. At the same time, the surface on which the additional material is applied can be cleaned by means of the plasma jet.

Instead of wires or profiles, the increase in the thickness for increasing the current-carrying capacity is applied by means of a plasma coating, the plasma spraying. This is a process in which conductive material is applied on a conventionally manufactured circuit carrier during or after the end of the production thereof. As a result, it is possible to realize an increase in the current-carrying capacity on the connection layers arranged on the outer surfaces of the circuit carrier by means of a partial increase in the layer thickness of the electrically conductive connections.

In comparison with an etching process, plasma spraying advantageously makes it possible to realize conductor structures that are less coarse in conjunction with increased layer thickness (occasionally also referred to as "thick copper"). The production of a connection layer with fine conductor structures, which are required for the connection of logic circuits, and also of connections with high current-carrying capacity for power circuits can thus be realized particularly simply. Unlike in an etching method, the thick-copper conduction structures need not be realized over the entire area of the circuit board, such that, for example, problems in the routing of a circuit board having both power components and logic components are avoided and more efficient production is achievable. In comparison with an additional photolithographic patterning and subsequent electrolytic reinforcement, laser spraying has a small number of process steps, such that the production of the circuit board is particularly cost-saving.

The carrier material layer composed of the electrically insulating material and the connection layer or connection layers applied at least on the surface or surfaces of the carrier material layer can be provided as a semifinished product, for example as a prepreg provided with the connection layer. Such a semifinished product may also be a standard circuit board—in particular a printed circuit board (PCB)—which has electrically conductive connections for the realization of logic circuits. In the case of such a standard circuit board, the layer thickness of a connection layer is generally between 30 µm and 35 µm. The conductor track width is generally 100 µm.

By contrast, electrically conductive connections having a very much greater layer thickness and/or conductor track width are required for the realization of a power circuit. Since, for the joint realization of a power and logic circuit, the area required for the power portion is very much smaller than that required for the logic portion, it suffices to provide only a small portion of the electrically conductive connections with corresponding current-carrying capacity.

According to the present invention this is effected by selectively applying additional electrically conductive material, in particular on the semifinished product described above. In order to avoid complicated production processes and in order to provide a high flexibility with regard to the interconnection to be realized, the additional electrically conductive material of at least some of the electrically conductive connections is produced by plasma spraying.

The production of the electrically conductive connection with increased current-carrying capacity separately from the production of the conventional circuit carrier results in a high flexibility in the production of the circuit carrier. At the same time, such a circuit carrier can be provided with comparatively low costs. Since it is possible to produce the electrically conductive connections with increased current-carrying capacity by computer-aided control of a plasma spraying apparatus, both large and small numbers of items can be provided cost-effectively.

In particular, the proposed circuit carrier resolves the conflict of aims that arises as a result of the process for the production of the standard circuit board provided as semifinished product comprising carrier material layer and connection layer applied at least on the first and/or the second surface of the carrier material layer and the production of conductor tracks with high current-carrying capacity.

In accordance with a further configuration, at least one further connection layer having a predefined layer thickness is arranged internally in the carrier material layer, wherein the further connection layer occupies an area region of the circuit carrier, wherein the area region is arranged below the component—in particular the power component—in a direction orthogonally with respect to the first or second surface, and the area region is reinforced by plasma spraying at least in sections with additional electrically conductive material, as a result of which a layer thickness greater than the predefined layer thickness is provided.

Applying the additional material in the case of a further connection layer is carried out during the production of the circuit carrier, which is then embodied as a multilayer circuit board. In particular, a first ply composed of the electrically insulating material is provided, said first ply being provided with the further connection layer, and a second ply composed of the electrically insulating material is provided. The further connection layer is reinforced at least in sections by means of plasma spraying with the additional electrically conductive material or a further electrically conductive material, wherein the additional or further electrically conductive material can also extend laterally from the further connection layer on or above the electrically insulating material. The first and second plies are subsequently joined together in order to produce the carrier material layer, such that the further connection layer including the reinforcement between the first and second plies is arranged internally in the carrier material layer. Afterward or beforehand, the connection layer can be applied on the first and/or second ply or on a further ply of the carrier material layer.

In particular, it is possible as a result to produce a heat spreading area which improves the heat dissipation in a lateral direction of the circuit carrier, i.e. parallel to a plane in which the first or second surface lies. By way of example, provision can be made for arranging such an area region below a power component which has a high heat emission during operation. With electrolytic methods, electrically conductive connections with high current-carrying capacity can be realized by contrast only on the outer areas of a circuit board.

In accordance with a further configuration, the at least one connection layer and/or the at least one further connection layer can be formed from a first electrically conductive material, in particular metal. The additional and/or further material can be formed from a second electrically conductive material, wherein the first material corresponds to the second material or is different than the latter. Copper is usually used as first conductive material. The second material can be copper, aluminum or bronze, for example.

In principle, it is expedient if the second electrically conductive material has ductile properties, that is to say if the layer composed of the additional material is pliable. This makes it possible, in particular, to use electrically conductive connections with additional material for increasing the current-carrying capacity also in bent or flexible circuit carriers. By way of example, the carrier material layer has a circuit board section in which the thickness of the electrically insulating material is reduced, such that the circuit board section is semiflexible. The reinforcement of the connection layer and/or of the further connection layer is then effected at least in the region of this circuit board section with a ductile metallic material as additional or further material, such that the semi flexibility of the circuit board section is maintained. In particular, the reinforcement of electrically conductive connections with additional material in the region of flexible sections of a circuit carrier can be carried out before the bending in this way.

The predefined layer thickness of the connection layer and/or of the further connection layer is, for example, 50 μm or less and, in particular, 10 μm or more; typically it is between 30 μm and 35 μm, inclusive of the limits. It is expedient if the thickness of the additional material is up to 30 times the predefined layer thickness. By way of example, the additional material for reinforcing the connection layer and/or the further connection layer is applied with a layer thickness of 200 μm or more; by way of example, the layer thickness is between 200 μm and 400 μm, inclusive of the limits. Preferably, the additional material for reinforcing the connection layer and/or the further connection layer is applied with a layer thickness of between 0.5 mm and 1 mm, inclusive of the limits. Such a layer thickness is particularly advantageous for a conductor track provided for a power circuit.

It is furthermore expedient if the width of the section reinforced with the additional material is up to 50 times the predefined conductor track width of a non-reinforced section. While the structure width of the connection layer and/or of the further connection layer may have for example a conductor track width customary for logic circuits of between 50 μm and 150 μm—e.g. of 100 μm—the width of a connection reinforced, in particular for a power circuit, by means of plasma spraying may be between 2 mm and 3 mm, in each case inclusive of the limits. In principle, even wider conductor tracks can also be produced by means of the plasma spraying method.

The additional material can be applied directly on the carrier material layer or a soldering resist. This results in high design freedoms. In particular, large-area heat spreading layers can be linked in places to electrically conductive sections of the connection layer. Such a heat spreading layer can be electrically insulated from other electrical connection layers.

It is possible, moreover, to allow the additional material to project laterally beyond the predefined conductor track width on the carrier material layer or the soldering resist. As a result, the provision of a conductor track with increased current-carrying capacity can also be implemented in such sections of an electrically conductive connection which is formed in the context of production as a conductor track for a logic circuit.

The additional material can additionally be applied areally on a soldering resist which covers the connection layers arranged on the first and/or second surface. By way of example, an electrically conductive shielding can be realized as a result.

In a further configuration, the additional material produces an electrical connection between two contact pads of two connections of the same connection layer, said contact pads originally being electrically insulated from one another. As a result, optional connections in the manner of a "jumper" can also be activated after the production of the standard circuit board by means of the plasma spraying process.

In a further configuration, the sections provided with the additional material may not be covered with a soldering resist. Furthermore, the sections not provided with the additional material may be covered with a soldering resist.

To summarize, a circuit carrier is provided in which, instead of the use of wires or profiles, an increase in the layer thickness of a conductor track is effected by plasma coating. As a result, the additionally applied material can be selected virtually freely. No electrolytic process is required. The form and thickness of an electrically conductive connection to be reinforced can be implemented by software and process control, if appropriate in combination with masks, which enables a high flexibility.

The additional material deposited by the plasma process can be applied directly on free metal or else on a soldering resist or directly on the material of the carrier material layer. The circuit carrier thus firstly makes it possible to realize large-area heat spreading layers which can also be linked to metallic constituents of one or more connection layers. Secondly, it is possible to realize ground or shielding layers for optimizing the electromagnetic compatibility. This is the case particularly when applying the additional material on the soldering resist applied on the connection layers applied on the surfaces. A further advantage is that when applying the additional material on the soldering resist of the circuit carrier, the additional material can be used as an additional layout plane.

The circuit carrier allows the combination of local thick conductor tracks for high current-carrying capacity with fine structures.

In particular, the circuit carrier may be a deep-milled circuit board in which the additional material is applied in a circuit board section having a reduced number of layers, i.e. in the bending region of a flexible circuit board section connecting two rigid circuit board sections. This is possible particularly with the use of ductile materials for the additional material.

Further aspects of the present disclosure are described in the following text, wherein the individual aspects are numbered in order to facilitate the reference to features of other aspects.

1. A circuit carrier for electronic components, comprising:
    a carrier material layer composed of an electrically insulating material having a first surface and a second surface, which is arranged parallel to the first surface;
    a connection layer which is applied at least on the first and/or the second surface of the carrier material layer and has in each case a predefined layer thickness, wherein each connection layer comprises a number of electrically conductive connections having a predefined conductor track width;
    where
    at least some of the connections are reinforced by plasma spraying with additional electrically conductive material, as a result of which a layer thickness greater than the predefined layer thickness and/or a conductor track width greater than the predefined conductor track width are/is provided.

2. The circuit carrier according to aspect 1, characterized in that the additional material is subsequently applied on the at least some connections of a standard circuit board.

3. The circuit carrier according to aspect 1 or 2, characterized in that at least one further connection layer having a predefined layer thickness is provided internally in the carrier material layer, wherein the further connection layer occupies an area region of the circuit carrier, wherein the area region is arranged below a component in a direction orthogonally with respect to the first or second surface, and the area region is reinforced by plasma spraying at least in sections with the additional electrically conductive material, as a result of which a layer thickness greater than the predefined layer thickness is provided.

4. The circuit carrier according to any of the preceding aspects 1 to 3, characterized in that the at least one connection layer and/or the at least one further connection layer are/is formed from a first electrically conductive material, in particular metal, and the additional material is formed from a second electrically conductive material, wherein the first material corresponds to the second material or is different from the latter.

5. The circuit carrier according to aspect 4, characterized in that the second electrically conductive material has ductile properties.

6. The circuit carrier according to aspect 4 or 5, characterized in that the second material is copper, aluminum or bronze.

7. The circuit carrier according to any of the preceding aspects 1 to 6, characterized in that the thickness of the additional material is up to 30 times the predefined layer thickness.

8. The circuit carrier according to any of the preceding aspects 1 to 7, characterized in that the width of the section reinforced with the additional material is up to 50 times the predefined conductor track width of a non-reinforced section.

9. The circuit carrier according to any of the preceding aspects 1 to 8, characterized in that the additional material is applied directly on the carrier material layer or a soldering resist.

10. The circuit carrier according to any of the preceding aspects 1 to 9, characterized in that the additional material projects beyond the predefined conductor track width on the carrier material layer or the soldering resist.

11. The circuit carrier according to any of the preceding aspects 1 to 10, characterized in that the additional material (24) is applied areally on a soldering resist which covers the connection layers arranged on the first and/or the second surface.

12. The circuit carrier according to any of the preceding aspects 1 to 11, characterized in that the additional material produces an electrical connection between two contact pads of two connections of the same connection layer, said contact pads originally being electrically insulated from one another.

13. The circuit carrier according to any of the preceding aspects 1 to 12, characterized in that the sections provided with the additional material are not covered with a soldering resist.

14. The circuit carrier according to any of the preceding aspects 1 to 13, characterized in that the sections not provided with the additional material are covered with a soldering resist.

The invention is explained in greater detail below on the basis of an exemplary embodiment in the drawings. Further advantages and advantageous configurations and developments of the method, of the circuit carrier and of the control unit are evident from the exemplary embodiment.

BRIEF DESCRIPTION OF THE SEVERAL VIEWS OF THE DRAWING

In the figures:

FIGS. 2a and 2b show a cross-sectional illustration and a plan view of a conventional circuit carrier, and FIGS. 3a and 3b show a cross-sectional illustration and a plan view of a circuit carrier according to the invention.

DESCRIPTION OF THE INVENTION

Figure 1:
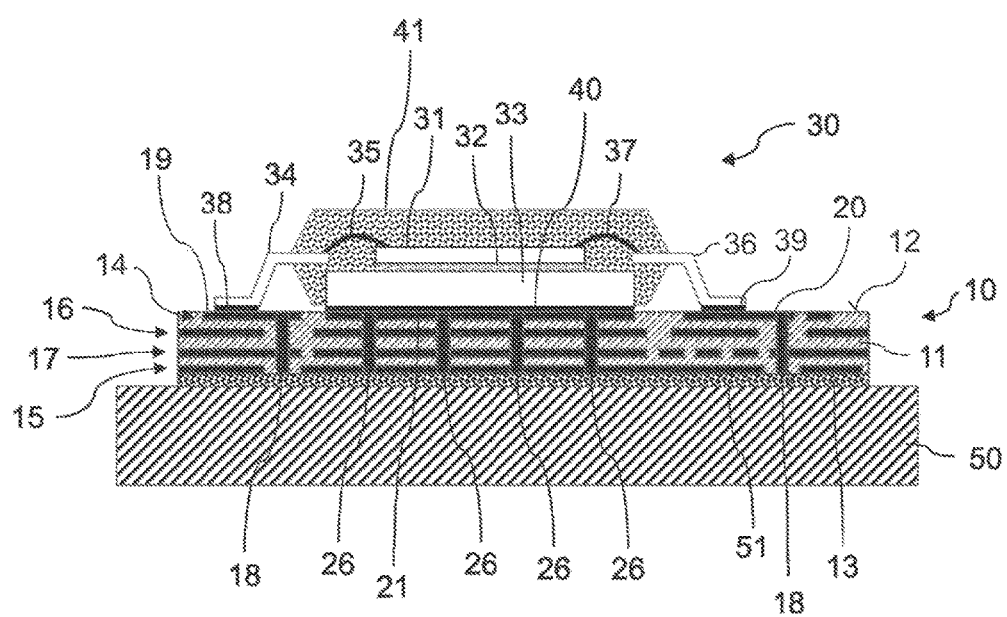
FIG. 1 shows a schematic cross-sectional illustration of an electronic component applied on a circuit carrier according to the invention.

FIG. 1 shows a schematic cross-sectional illustration of a circuit carrier 10 according to the invention, on which circuit carrier an electronic component 30 is applied by way of example. The circuit carrier 10 in the form of a circuit board has a carrier material layer 11 composed of an electrically insulating material. Glass fiber mats impregnated with epoxy resin (known by the material identifier FR4) can be used as material of the carrier material layer 11. For special applications it is also possible to use other materials, such as e.g. Teflon, aluminum oxide or ceramic and also polyester film in flexible circuit boards. The carrier material layer 11 has a first surface 12 facing the component 30, and a second surface 13 facing a carrier plate 50 of the entire arrangement, said carrier plate serving as a heat sink.

In the exemplary embodiment shown in FIG. 1, a first connection layer 14 is applied on the first surface 12 and a second connection layer 15 is applied on the second surface 13. In addition, by way of example, a third connection layer 16 and a fourth connection layer 17 are arranged (optionally) internally in the carrier material layer 11. Each of the connection layers 14, 15, 16, 17 forms a dedicated conductor trace structure having a respectively predefined layer thickness.

Each conductor trace structure comprises a number of electrically conductive connections (so-called conductor traces) having a predefined conductor track width. At ends of conductor traces, connection pads or the like can be formed, the width of which deviates from the conductor track width. The conductor traces of respective connection layers 14, 15, 16, 17 can be electrically interconnected among one another by means of so-called plated-through holes 18 (so-called vias). The layer thickness of a respective connection layer 14, 15, 16, 17 is typically between 30 μm and 35 μm. The thickness of these layers, also referred to as base copper, may also be smaller or larger in individual cases. The conductor track width of the conductor traces provided for signal transmission is approximately 100 μm. In this respect, the circuit carrier 10 constitutes a standard circuit board having a conductor trace structure for a logic circuit which can be manufactured in a production process as known to the person skilled in the art and described in the introduction.

If both a logic circuit and a power circuit are intended to be realized on such a circuit carrier, then the realization of the power circuit requires electrically conductive connections which have a very much greater layer thickness and/or conductor track width for carrying the high currents required. For the joint realization of a power and logic circuit, the area required for the power circuit is usually very much smaller than that required for the logic circuit. Therefore, it suffices to provide only a portion of the electrically conductive connections with corresponding current conductivity.

In the further description it is assumed that the component 30 shown in FIG. 1 is a power component whose connection requires conductor trace structures having greater current conductivity than the conductor trace structures produced in the context of the production of a standard circuit board.

The component 30 comprises a semiconductor chip 31, for example, in a manner known to the person skilled in the art, said semiconductor chip being applied, by means of a solder layer 32, on a heat sink 33 composed of a material having good thermal conductivity. With its main area facing away from the semiconductor chip, the heat sink 33 is linked to a heat spreading area 21 of the first connection layer 14 by means of a solder or some other layer 40 having good thermal conductivity. The heat spreading area 21 constitutes an area of the first connection layer 14 that corresponds to the area of the heat sink 33.

The task of the heat spreading area 21 is to laterally distribute the heat generated by the semiconductor chip 31 under the heat sink 33. By means of plated-through holes 26 of the circuit carrier 10 that are arranged in a distributed manner below the heat spreading area 21, heat can then be dissipated to the hot plate 50 embodied as a heat sink. For this purpose, the carrier plate 50 is linked to the second surface 13 of the circuit carrier 10 by means of a heat-conducting material 51.

An electrical linking of the semiconductor chip 31 to the conductor trace structure of the first connection layer 14 of the circuit carrier 10 is effected by means of bonding wires 35, 37 and assigned connection elements 34, 36, which are electrically connected by their free ends to assigned connection pads 19, 20 by means of a respective solder layer 38, 39. The semiconductor chip 31 and the bonding wires 35, 37 and also the heat sink 33 are arranged in a housing 41, which is generally formed from an injection-molded material. The method according to the invention and the circuit carrier according to the invention are also suitable for differently constructed power components. By way of example, the power component may be one of the following components: capacitor, coil, power transistor, thyristor.

In order, firstly, to be able to conduct the currents generated during the operation of the component 30 with low resistance and, secondly, also to be able to perform a good lateral distribution of the heat emitted by the component 30—in particular by the semiconductor chip 31—during operation, at least the connection pads 19, 20, conductor trace structures electrically connected thereto and also the heat spreading area 21 of the circuit carrier are reinforced with additional electrically conductive material. The reinforcement is carried out by plasma spraying, such that a greater layer thickness is obtained in comparison with the predefined layer thickness of the conventionally produced connection layer 14. This is evident by way of example in FIGS. 2a, 2b, 3a and 3b.

FIGS. 2a and 2b show a cross-sectional illustration and a plan view of a conventional circuit carrier 10, in which the first connection layer, arranged on the first surface 12, and provided for example for the production of the circuit carrier 10, is not yet reinforced with additional electrically conductive material. Conductor traces which carry logic signals and are assigned to a logic circuit are identified by the reference sign 22. The two conductor traces 23, running parallel for example, are assigned to a power circuit (not illustrated in more specific detail). The conductor traces 22, 23 may have kinks and bends. The invention is not restricted to the rectilinear form chosen merely to simplify the figures.

In a conventional circuit carrier, as is evident from the cross-sectional illustration in FIG. 2a, the conductor traces 22 and 23 are of identical height, that is to say that they have the same layer thickness. By contrast, it is readily evident that, for carrying the significantly greater currents, the conductor traces 23 have a significantly greater width then the conductor traces 22. However, problems described further above thus arise during production.

By contrast, FIGS. 3a and 3b show a circuit carrier 10 embodied according to the invention. Here, too, the illustration shows the first connection layer 14 on the first surface 12 of the circuit carrier 10. The first connection layer 14 once again comprises conductor traces 22 for a logic circuit (not illustrated in more specific detail) and conductor traces 23 for a power circuit (likewise not illustrated in more specific detail) for the shaping of which the explanations above are likewise applicable.

As is evident in the direct comparison of FIGS. 2b and 3b, the conductor traces 23 for the power circuit are configured such that they are significantly narrower, by way of example. It is evident from the cross-sectional illustration in FIGS. 2a and 3a, however, that the cross section required for carrying a corresponding current is realized by applying an additional material 25 on the material 24 of the connection layer with predefined layer thickness. Conductor traces 23 of greater width—as illustrated in FIG. 2a—are also usable for the method according to the invention. A particularly high current-carrying capacity and heat spreading can be realized in this case.

Applying the additional material is carried out by plasma coating, i.e. by a plasma spraying process. It is thereby possible to obtain layer heights for the conductor trace 23 of between 0.5 mm and 1.0 mm and conductor trace widths of between 2.0 mm and 3.0 mm (or even wider still). While copper is preferably used as material for the production of the first connection layer 14, the additional material 24 applied by the plasma spraying process can be selected according to the requirements. By way of example, likewise copper or alternatively aluminum or bronze can be used. Preferably, the additionally applied material 24 is ductile, such that use on flexible circuit boards is also made possible.

Applying the additional material by means of the plasma spraying process is preferably implemented on a structure of the relevant connection layer that was produced previously by means of a conventional production process (i.e. in particular a structure having a layer thickness of 30 μm to 35 μm and a conductor trace width of approximately 100 μm), and is therefore oriented to the geometry thereof. It is nevertheless possible also to apply additional material 24 going laterally beyond the width of a previously produced conductor trace. In particular, it is even possible to apply additional material on a soldering resist that is typically applied areally on the circuit carrier for terminating and protecting the first and/or second connection layer. If the additional material applied on a soldering resist is applied areally, then it can perform an electromagnetically shielding function. Alternatively, the additional material on the soldering resist of the circuit carrier can be used as an additional layout plane.

The great flexibility of the plasma spraying process enables a subsequent adaptation of the circuit structure. By way of example, it is possible to produce electrical connections between respective connection pads of the first connection layer 14 and/or of the second connection layer 15. By way of example, configurations in the manner of a "jumper" can be performed as a result.

There is the possibility of so-called pad adaptation in components. By way of example, in large passive components, such as e.g. coils, different connection pad configurations (so-called footprints) can be individually adapted by means of the plasma spraying process. Changing the circuit board layout, which may be associated for example with the production of new photolithography masks, is advantageously not necessary for this purpose.

The plasma coating can also be used for selectively altering conductor trace structures of connection layers arranged internally in the circuit carrier. For this purpose, it is necessary to modify the conventional process for producing a standard circuit board by the connection of respective layers being preceded by a processing of the internally located connection layers by plasma coating. As a result, by way of example, it is possible to increase the current-carrying capacity between two components or between a component and a plug as interface toward the outside. Likewise, additional electrically conductive material can partially be provided under a component in order to obtain a better buffering and heat spreading internally in the circuit carrier.

The technique of plasma coating can be employed in the case of flexible, in particular, deep-milled circuit boards in the region having a reduced number of layers, i.e. in the bending region. As a result, it is possible to increase the current-carrying capacity between circuit board portions connected by a flexible portion.

The invention claimed is:

1. A method for producing a circuit carrier for electronic components, the method comprising:
    providing a carrier material layer composed of an electrically insulating material having a first surface and a second surface, which is arranged parallel to the first surface, and a connection layer on at least one of the first and second surfaces of the carrier material layer, the connection layer having a predefined layer thickness and including a plurality of electrically conductive connections with a predefined conductor track width;
    reinforcing at least some of the connections, at least in sections thereof, by plasma spraying with additional electrically conductive material, to form reinforced connections, at least in sections thereof, with a conductor track width that is greater than the predefined conductor track width; and
    thereby applying the additional material at least in places areally on a soldering resist or directly on the carrier material layer.

2. The method according to claim 1, wherein the step of providing the carrier material layer with the connection layer comprises providing a standard circuit board with the electrical connections, and the reinforcing step comprises subsequently applying additional material on some of the connections of the standard circuit board.

3. The method according to claim 1, wherein the step of providing the carrier material layer with the said connection layer comprises the following steps:
    providing a first ply composed of the electrically insulating material, and a further connection layer of a predefined layer thickness on the first ply;
    reinforcing the further connection layer, at least in sections thereof, with the additional electrically conductive material by plasma spraying, to obtain a layer thickness greater than the predefined layer thickness;
    providing a second ply composed of the electrically insulating material;
    joining together the first ply and the second ply, to thereby arrange the further connection layer internally inside the carrier material layer; and
    applying the said connection layer; and
    forming the further connection layer in such a way that the further connection layer occupies an area region of the circuit carrier which is arranged underneath a component in a direction orthogonally to the first or second surface, and the area region is reinforced by the plasma spraying at least in section with the additional electrically conductive material.

4. The method according to claim 1, which comprises applying a metal selected from the group consisting of copper, aluminum and bronze as additional electrically conductive material during the plasma spraying.

5. The method according to claim 1, which comprises applying the additional material areally on the soldering resist, with the soldering resist covering the connection layer arranged on the first and/or the second surface.

6. The method according to claim 1, which comprises forming the reinforced connections with a layer thickness that is greater than the predefined layer thickness.

* * * * *